United States Patent [19]

Mueller et al.

[11] Patent Number: 5,517,117
[45] Date of Patent: May 14, 1996

[54] METHOD FOR SPATIALLY RESOLVED MEASUREMENT OF BLOOD FLOW USING NUCLEAR MAGNETIC RESONANCE

[75] Inventors: Edgar Mueller, Heroldsbach; Richard Hausmann, Erlangen, both of Germany

[73] Assignee: Siemens Aktiengesellschaft, Munich, Germany

[21] Appl. No.: 320,259

[22] Filed: Oct. 11, 1994

[30] Foreign Application Priority Data

Nov. 3, 1993 [DE] Germany ............... 43 37 503.0

[51] Int. Cl.⁶ ................................. G01R 33/20
[52] U.S. Cl. ............................ 324/306; 128/653.3
[58] Field of Search .................................. 324/306, 307, 324/309, 300; 128/653.2, 653.3

[56] References Cited

U.S. PATENT DOCUMENTS

| | | | |
|---|---|---|---|
| 4,698,592 | 10/1987 | Feinberg | 324/306 |
| 4,718,424 | 1/1988 | Nishimura | 324/306 |
| 4,748,411 | 5/1988 | Holland | 324/309 |
| 4,849,697 | 7/1989 | Cline et al. | 324/306 |
| 4,947,837 | 8/1990 | Sano et al. | 128/653 |
| 5,221,909 | 7/1993 | Takiguchi et al. | 324/306 |
| 5,243,283 | 9/1993 | Tokunaga et al. | 324/306 |
| 5,251,628 | 10/1993 | Foo | 128/653.2 |

FOREIGN PATENT DOCUMENTS

| | | | |
|---|---|---|---|
| 0142343B1 | 1/1989 | European Pat. Off. | G01N 24/08 |
| 0115642B1 | 12/1989 | European Pat. Off. | G01N 24/08 |

*Primary Examiner*—Sandra L. O'Shea
*Assistant Examiner*—Raymond Y. Mah
*Attorney, Agent, or Firm*—Hill, Steadman & Simpson

[57] ABSTRACT

For shortening the measuring time to obtain an image identifying blood flow in a subject using magnetic resonance imaging, the number of phase-coding steps is reduced compared to a number of steps required for generating a quadratic observation window, given a constant, maximum amplitude of the phase-coding gradient. The reduction is to such an extent that only the blood vessel under observation is essentially acquired in phase-coding direction. Neighboring regions are saturated in order to avoid image artifacts. Given a correspondingly low number of phase-coding steps, a measurement of blood flow is possible in real-time presentation or, given an ECG triggered measuring sequence, a measurement of blood flow is possible in a greatly shortened overall measuring time.

7 Claims, 4 Drawing Sheets

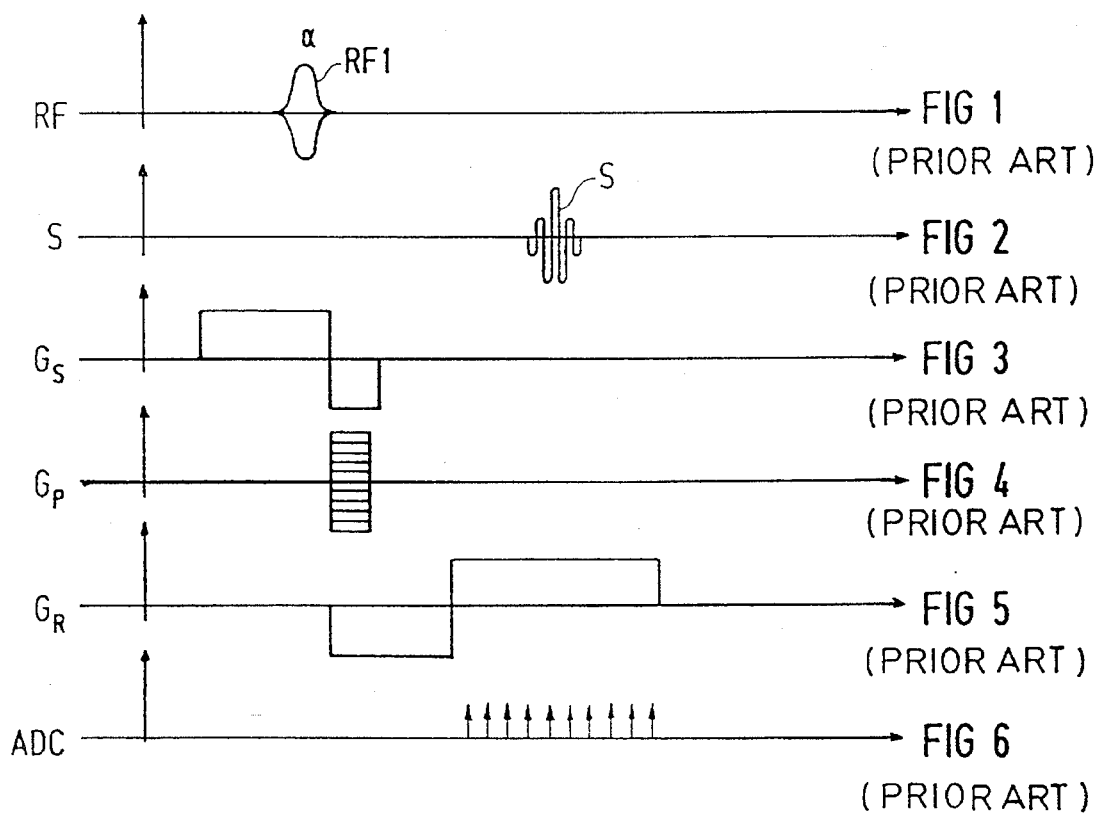

METHOD FOR SPATIALLY RESOLVED MEASUREMENT OF BLOOD FLOW USING NUCLEAR MAGNETIC RESONANCE

BACKGROUND OF THE INVENTION

The present invention is directed to a method for at least two-dimensionally, spatially resolved measurement of blood flow with nuclear magnetic resonance, of the type wherein nuclear magnetic resonance signals are excited with a flow-sensitive pulse sequence and are read out, and wherein this pulse sequence contains slice selection gradients, phase-encoding gradients and read-out gradients respectively residing perpendicularly relative to one another.

DESCRIPTION OF THE PRIOR ART

In the measurement of blood flow, the course of the blood flow during a heart period should generally be acquired in a chronologically resolved manner. Even given the fast MR imaging methods currently available, the duration prescribed by the heart period is not adequate in order to generate spatially resolved images in two dimensions in real time. One therefore generally employs a triggering, i.e. the heartbeat period is divided into a plurality of phases and measuring events are started with trigger signals derived from an ECG measurement. A line of a raw data matrix is measured for every motion phase in every heartbeat period. A plurality of heartbeats corresponding in number to the number of lines of the raw data matrix is then required for registering the complete images. Two to six minutes of measuring time are typically required in order to produce a series of ECG-triggered images given the standard, quadratic image matrix.

A significant shortening of the measuring time can be achieved by foregoing the spatial resolution in one direction, i.e. a data set that merely corresponds to a single projection is acquired. This, however, reduces the diagnostic value of the procedure.

U.S. Pat. No. 4,748,411 discloses a method for shortening the data acquisition time given stationary tissue. This method is based on the fact that the examination subject, usually a patient, has less of an expanse in one direction in a selected slice than in the other direction. Given the standard quadratic measuring matrix, not only are data in the region occupied by the patient within the selected slice obtained but also "dead space" is measured within the selected slice. In order to shorten the data acquisition time, the number of phase-encoding steps is reduced corresponding to the ratio of the object expanse in the phase-coding direction to a quadratic observation window. The size of the phase-coding steps is reduced in the same ratio, so that a reduced number of phase-coding steps covers the same total range of phase-coding angles. The resulting image is thus stretched in the phase-coding direction and is in turn distortion-corrected on the basis of a corresponding compression.

SUMMARY OF THE INVENTION

An object of the invention is to shorten the required measuring time for the measurement of blood flow using nuclear magnetic resonance techniques.

This object is inventively achieved in a method wherein the zones adjoining the blood vessel to be acquired are saturated before the pulse sequence by applying saturation pulses, the phase-coding gradient is generated essentially perpendicularly relative to the blood flow direction; and the number of phase-coding steps is reduced in comparison to a number of steps required for generating a quadratic observation window with an unaltered maximum amplitude of the phase-coding gradient. The reduction is to such an extent that essentially only data for the blood vessel under observation are acquired in the phase-coding direction. Since the number of phase-coding steps is reduced in relation to the reduction in size of the observation window, the measuring time also decreases given an unaltered topical resolution. Differing from the known technique of the rectangular observation window, regions outside the examination subject are not blanked out in the method of the invention; rather, a designated blood vessel is acquired within the examination subject, as a result of which an especially clear reduction in the measuring time arises due to the generally small expanse of blood vessels in the transverse direction. Over-convolutions of these zones in the image region are prevented by the saturation of edge zones.

DESCRIPTION OF THE DRAWINGS

FIGS. 1–6 illustrate the pulses comprising a known flash sequence.

DESCRIPTION OF THE PREFERRED EMBODIMENTS

A conventional gradient echo sequence is shown in FIGS. 1–6 for explaining the problem alleviated by the inventive method. According to FIG. 1, a radio-frequency pulse RF1 is first activated, tilting the nuclear spins out of their equilibrium position by the angle α. Since the radio-frequency pulse RF1 is emitted under the influence of the positive sub-pulse of a slice selection gradient $G_S$, the excitation only ensues within a slice prescribed by the slice selection gradient $G_S$ and at the frequency of the radio-frequency pulse RF1. In a further phase, the dephasing produced by the positive sub-pulse is in turn canceled by a negative sub-pulse of the slice selection gradient $G_S$. Further, a phase-encoding gradient $G_P$ and a negative sub-pulse of a read-out gradient $G_R$ are generated. A nuclear magnetic resonance signal S is obtained by reversing the read-out gradient $G_R$. This nuclear magnetic resonance signal S is sampled with an analog-to-digital converter at the points in time shown on a time axis in FIG. 6. As a result of n-fold sampling, n measured values are obtained. These measured values are digitized and are entered into a row of a raw data matrix.

The illustrated pulse sequence is repeated n times, with the phase-encoding gradient being altered from a maximum, negative value $-G_{P_{max}}$ in identical steps from sequence to sequence, to a positive value $G_{P_{max}}$. The ordering of the nuclear magnetic resonance signals in the individual rows ensues in accord with the phase factor of the individual spin echoes prescribed by the respective phase-encoding gradient $G_p$.

Figure 7:
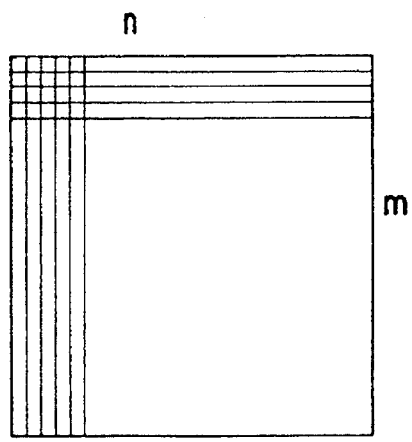
FIG. 7 is a schematic view of a raw data matrix.

The raw data matrix is generally quadratic, i.e. n=m applies. Typically, the raw data matrix comprises 256 rows, so that the pulse sequence shown in FIGS. 1–6 must be repeated 256 times in order to obtain the required number of 256 signals. Such a raw data matrix is schematically shown in FIG. 7.

An image can be acquired in a known way by two-dimensional Fourier transformation from the raw data matrix acquired in this way.

Since 256 measurements are required for each image, the measurement of the blood flow that is normally periodic with the heartbeat rate is not possible in real time. The acquisition of the measured data in known methods ensues by triggering, i.e. only some of the rows of a raw data matrix are acquired in every period of a cardiac cycle. An image thus can be constructed only after a plurality of head cycles. Measuring times of 2–6 minutes typically arise in order to obtain a series of ECG-triggered images with quadratic image matrices. Given such long measuring times, however, the patient under examination can no longer hold his or her breath, so that artifacts due to respiratory motion arise.

Figure 8:
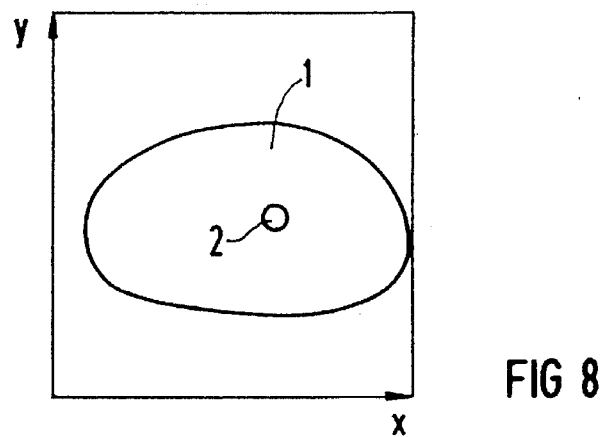
FIG. 8 is a schematic view of an examination subject.

When one wishes to measure the blood flow in a specific vessel, it is adequate in practically all instances to greatly restrict the expanse of the observation window in one direction. FIG. 8 schematically shows a cross section through a body 1 having a blood vessel 2 to be portrayed in an x-y coordinate system. The observation window (field of view) could be restricted to a significantly smaller area without further difficulty for measuring blood flow, for example to the unshaded region of FIG. 9. When the phase-encoding gradient $G_p$ lies in the y-direction, this reduction is achieved in that the number of phase-coding steps is reduced corresponding to the diminution of the observation window in the y-direction. Since the spatial resolution that can be obtained in the phase-coding direction is dependent on the maximum phase-coding amplitude, the highest and lowest of the phase-coding gradients are retained for the outer rows of the raw data matrix and are modified corresponding to the difference from phase-coding step to phase-coding step.

This procedure initially leads to the fact that the resulting image is stretched in the phase-coding direction. Before the presentation on a monitor, the image is therefore expediently in turn compressed in a corresponding relationship.

The phase of the nuclear magnetic resonance signals is evaluated for the flow measurement. In order to produce a defined relationship between flow—i.e., the motion of the nuclear spins—and phase position of the corresponding nuclear magnetic resonance signals, a specific gradient for the flow-coding will be expediently introduced. A corresponding pulse sequence is shown in FIGS. 10–15. When the part of the sequence preceding the radio-frequency excitation pulse RF1 is initially left out of consideration, then this pulse sequence differs from that according to FIGS. 1–6 only in that a bipolar gradient pulse $G_{R1}$ is inserted between the excitation interval and the read-out interval according to FIG. 14. The positive and negative sub-areas of this gradient pulse $G_{R1}$ are identical, so that it has no influence on the phase position of stationary spins. By contrast thereto, this bipolar gradient pulse $G_{R1}$ effects a phase-coding of moving spins. European Application 0 115 642 discloses further details with respect to the functioning of this bipolar gradient pulse.

In practice, the exact identification of flow is not possible with a single measurement because of offset effects. A second measurement is therefore generally implemented, wherein the flow is differently phase-coded by means of a second bipolar gradient. For example, the bipolar gradient $G_{R1}$ can be inverted in the second measurement to form the second bipolar gradient, and the flow can then be exactly identified from the phase difference between the two signals acquired in this way. It is also possible to dimension the two bipolar gradient pulses such that the flow-dependency of the phase of the nuclear spins is eliminated. This is disclosed, for example, in European Application 0 142 343 wherein a gradient pulse sequence is employed which exhibits a first moment equal to zero relative to the point in time used to define the phase. The exact, flow-dependent phase can also be calculated on the basis of such a measurement using difference formation.

Figure 9:
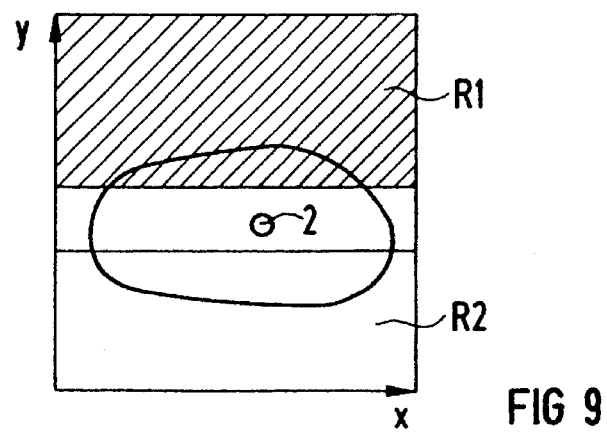
FIG. 9 is a schematic view of an examination subject with saturated zones produced according to the invention.
Figure 10:
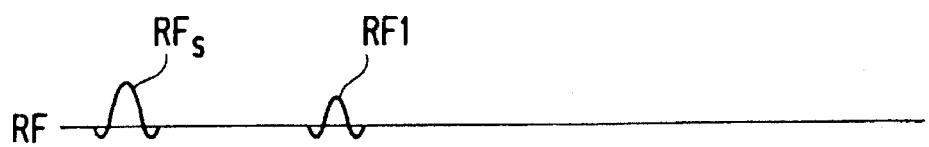
FIGS. 10–15 a pulse sequence having selective saturation and having a bipolar gradient pulse for influencing the flow-dependency of phase shifts in the nuclear magnetic resonance signal for accomplishing the inventive method.
Figure 11:
Figure 12:
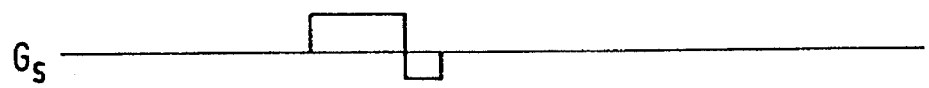
Figure 13:
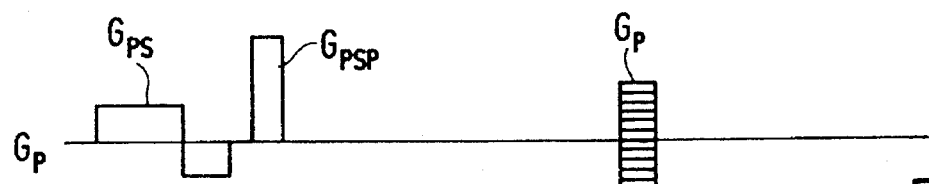
Figure 14:
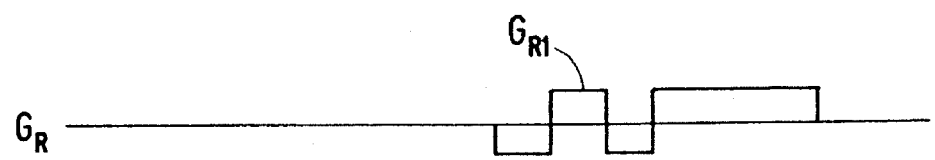
Figure 15:

When, as heretofore set forth, the observation window is constricted, artifacts can occur due to signal parts of nuclear spins that lie outside the observation window. In order to avoid this, the regions shown entered with broken lines in FIG. 9 outside the observation window are saturated, so that these cannot supply a signal contribution. For example, the saturation can ensue with a saturation radio-frequency pulse $RF_S$ according to FIG. 10. This saturation radio-frequency pulse $RF_S$ comprises a flip angle of 90° and is emitted under the influence of a selection gradient $G_{PS}$ in the later phase-coding direction. The saturation radio-frequency pulse $RF_S$ also has a frequency spectrum which causes the nuclear spins in the regions R1 and R2 to be tilted into the trans-versal attitude under the influence of the selection gradient $G_{PS}$. The phase coherency of the previously excited nuclear spins is destroyed by a following, high-amplitude spoiler gradient pulse $G_{PSP}$ that, according to FIG. 13, can likewise lie, for example, in the direction of the following phase-encoding gradient $G_p$, so that these nuclear spins cannot supply any signal contribution. The regions R1 and R2 of FIG. 9 are thus saturated, i.e. these regions supply no signal contribution during the following excitation and read-out event, so that artifacts are avoided.

Image excerpts can be extremely quickly measured with the method of the invention, so that a real-time presentation—even without ECG triggering under certain circumstances—becomes possible dependent on the required chronological and topical resolution. When, for example, only eight phase-coding steps and a repetition time of 5 ms for the pulse sequence are provided, an image excerpt having the vessel of interest can be measured in 40 ms. One can thereby have recourse to conventional pulse sequences without extreme hardware demands.

Figure 16:
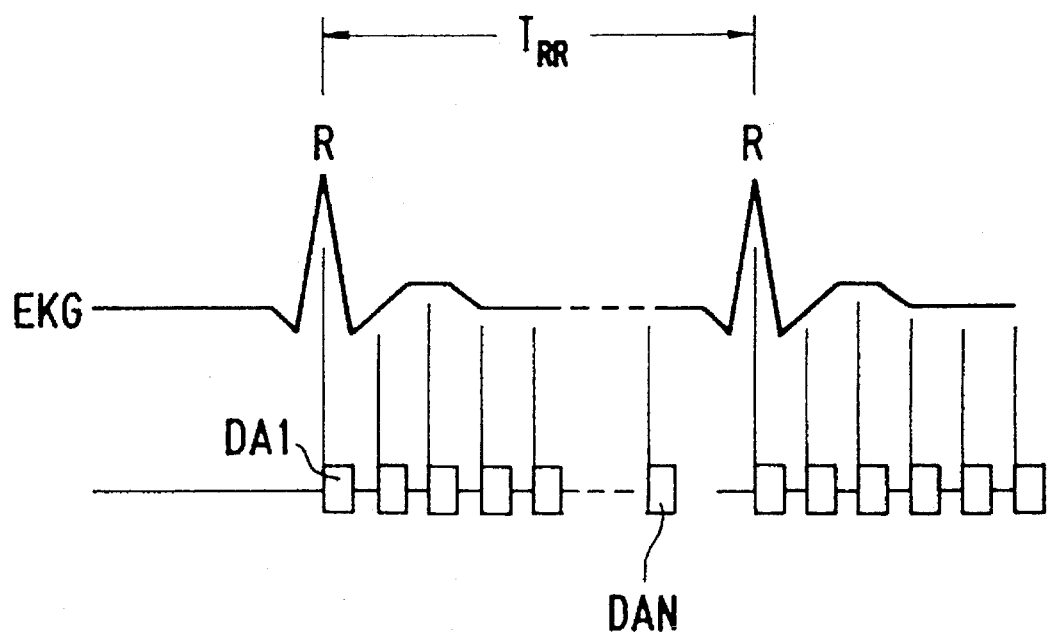
FIG. 16 a pulse sequence with triggering for use in the inventive method.

The disclosed method, however, can also be implemented with ECG triggering. This is set forth below with reference to FIG. 16. This shows an ECG having R-waves occurring at a repetition time $T_{RR}$. A sequence of data acquisitions phases DA1–DAN is respectively triggered with every R-wave. The data acquisition phases DA1–DAN are to be respectively allocated to different images that reproduce the blood flow in N different time phases within a heart period.

A pulse sequence according to FIGS. 10–15 is produced in every data acquisition phase DA1–DAN. Only one phase-coding step, for example, is implemented in every data acquisition phase, i.e. one row of the allocated raw data matrix is acquired. The other rows of the raw data matrices are acquired after the following trigger pulses R. If a raw data matrix has, for example, eight rows (phase-coding steps), then eight ECG periods are required in order to produce a complete raw data matrix for the N images. Given the condition that the ECG (i.e., the heartbeat) and the blood flow related thereto proceed periodically, the chronological course of the blood flow can be acquired from the N images acquired in this way. Although real-time exposures are not obtained in this way, the "stroboscopic" chronological resolution can in fact be improved by comparison to real-time registration.

Although modifications and changes may be suggested present invention has been described with reference to a specific embodiment, those of skill in the art will recognize that changes may be made thereto without departing from the scope and spirit of the invention as set forth in the appended claims.

We claim as our invention:

1. A method for at least two-dimensional, spatially resolved measurement of blood flow comprising the steps of:

exciting nuclear spins in, and reading resulting nuclear magnetic signals out of, an examination subject containing a blood vessel having a blood flow therein flowing in a flow direction and having zones adjoining said blood vessel with a flow-sensitive pulse sequence containing mutually perpendicular slice-selection gradients, phase-encoding gradients and read-out gradients, said phase-coding gradients being altered step-by-step in said pulse sequence;

sampling and digitizing said nuclear magnetic resonance signals and entering the sampled and digitized nuclear magnetic resonance signals into respective rows of a raw data matrix with one row of said raw data matrix being filled per each phase-encoding step;

applying saturation pulses to said examination subject before said pulse sequence for saturating said zones of said subject adjoining said blood vessel;

orienting said phase-encoding gradient in said pulse sequence so as to be substantially perpendicular to a flow direction of said blood flow in said vessel; and reducing the number of phase-encoding steps in comparison to a number of phase-encoding steps required for generating a quadratic observation window given a constant, maximum amplitude of said phase-encoding gradient, so that essentially only nuclear magnetic resonance signals arising from said blood vessel are acquired in the phase-encoding direction.

2. A method as claimed in claim 1 comprising the additional step of:

generating an image of said blood vessel from said nuclear magnetic resonance signals; and compressing said image in the phase-encoding direction by an amount corresponding to the reduction of the phase-encoding steps.

3. A method as claimed in claim 1 wherein the step of exciting nuclear spins in, and reading nuclear magnetic resonance signals from, said examination subject comprises applying a FLASH sequence to said examination subject as said pulse sequence.

4. A method as claimed in claims 1 comprising the additional step of:

employing a pulse sequence containing a first bipolar gradient pulse dimensioned for causing flow-dependent phase shifts in said nuclear magnetic resonance signals; and evaluating said phase-shifts in said nuclear magnetic resonance signal for acquiring information about said blood flow.

5. A method as claimed in claim 4 comprising the additional step of applying an additional pulse sequence to said examination subject having a second bipolar gradient pulse dimensioned for causing a different flow-dependent phase shift than the first bipolar gradient pulse, and forming a difference between the two phases of the nuclear magnetic resonance signals resulting from said first and second bipolar gradient pulses.

6. A method as claimed in claim 5 wherein the step of applying an additional pulse sequence having said second bipolar gradient pulse comprises applying an additional pulse sequence having a second bipolar gradient pulse having a zero first moment relative to a point in time defining said phase in the excitation of said spins so that no flow-dependent phase shift occurs in the nuclear magnetic resonance signals arising due to said second bipolar gradient pulse.

7. A method as claimed in claim 1 comprising the additional steps of:

acquiring an ECG signal from said examination subject, said ECG signal containing a periodic wave form;

triggering a data acquisition of nuclear magnetic resonance signals to fill a raw data matrix during a selected plurality of periods following one occurrence of said periodic wave form in said ECG signal with only a portion of said phase-encoding steps occurring per data acquisition; and completing filling of said raw data matrices in a plurality of data acquisitions respectively following a plurality of different triggering dependent on said period wave form.

* * * * *